(12) United States Patent
Huang

(10) Patent No.: US 7,259,988 B2
(45) Date of Patent: Aug. 21, 2007

(54) METHOD FOR MANAGING MEMORY BLOCKS IN FLASH MEMORY

(75) Inventor: Yi-Hsiang Huang, Taipei (TW)

(73) Assignee: Phison Electronics Corp., Hsinchu (TW)

( * ) Notice: Subject to any disclaimer, the term of this patent is extended or adjusted under 35 U.S.C. 154(b) by 0 days.

(21) Appl. No.: 11/163,128

(22) Filed: Oct. 6, 2005

(65) Prior Publication Data

US 2007/0081385 A1  Apr. 12, 2007

(51) Int. Cl.
*G11C 16/06* (2006.01)
*G11C 16/04* (2006.01)

(52) U.S. Cl. ............................ 365/185.09; 365/185.33; 711/170

(58) Field of Classification Search ............ 365/185.09
See application file for complete search history.

(56) References Cited

U.S. PATENT DOCUMENTS

| | | | |
|---|---|---|---|
| 6,226,202 B1 * | 5/2001 | Kikuchi | 365/185.33 |
| 6,622,196 B1 * | 9/2003 | Mitani | 711/5 |
| 6,901,498 B2 * | 5/2005 | Conley | 711/173 |
| 6,950,918 B1 * | 9/2005 | Estakhri | 711/168 |
| 2004/0177216 A1 * | 9/2004 | Asari et al. | 711/103 |
| 2005/0162947 A1 * | 7/2005 | Kim et al. | 365/200 |
| 2005/0195661 A1 * | 9/2005 | Conley | 365/189.05 |
| 2005/0204187 A1 * | 9/2005 | Lee et al. | 714/8 |
| 2005/0285248 A1 * | 12/2005 | See et al. | 257/681 |

* cited by examiner

*Primary Examiner*—Son L. Mai
(74) *Attorney, Agent, or Firm*—Jianq Chyun IP Office

(57) ABSTRACT

The present invention discloses a method for managing memory blocks in a flash memory. The method is first to calculate the total number of good blocks and total number of bad blocks in the flash memory, and then all the good blocks and the bad blocks will be evenly allocated to each segment according to the number of segments contained in the flash memory. After the allocation, the allocation information will be recorded in one good block to form a data block so that when the flash memory is executing initialization, the controller chip may find the data block, and store the data in the SRAM (static random access memory) of the flash memory. Then, according to the data stored in the SRAM, the controller chip may generate a corresponding table for the block contained in the segment according to the data stored in the SRAM. As a result, the flash memory may be used with lower capacity and may obviate the problem of being unusable when the flash memory contains the excessive amount of the bad blocks.

3 Claims, 3 Drawing Sheets

```
┌─────────────────────────────────────────┐
│ The controller chip finds the data block │──100
│ that stores the number of segments, the  │
│ number of the good blocks in each segment│
│ and the related boundary information in the│
│ flash memory and then stores the data    │
│ into the SRAM of the controller chip.    │
└─────────────────────────────────────────┘
                    │
                    ▼
┌─────────────────────────────────────────┐
│ To build boundaries and segments in the │
│ flash memory according to the boundary  │──110
│ and segment information stored in the SRAM.│
└─────────────────────────────────────────┘
                    │
                    ▼
        ┌───────────────────────┐
        │ To examine good blocks in │──120
        │ the each segment.     │
        └───────────────────────┘
                    │
                    ▼
        ┌───────────────────────────┐
        │ To build a corresponding table │──130
        │ for the block contained in the │
        │ segment.                  │
        └───────────────────────────┘
```

*FIG. 3*

METHOD FOR MANAGING MEMORY BLOCKS IN FLASH MEMORY

BACKGROUND OF THE INVENTION

1. Field of the Invention

The present invention relates to a method for managing memory blocks in a flash memory and, more particularly, to a managing method that utilizes the number of the good blocks in the flash memory to adjust the flash memory capacity so that the flash memory can be used with lower capacity.

2. Description of the Related Art

The evolution of non-volatile memory has been very remarkable, from a series of ROM (read only memory), such as Mask-ROM, OTP ROM (one time programmable read only memory), EPROM (erasable and programmable read only memory) and EEPROM (electrically erasable and programmable read only memory), to a powerful information storage device called flash memory. Among them, flash memory has been the focus of spotlight because it has all the credits that a common non-volatile memory has and goes beyond that; that is, flash memory has faster reading speed and lower power consumption for information storage than other non-volatile memories. For this reason, flash memory has been playing a significant role in the semiconductor industry. In recent years, some manufacturers even combine controller chip to flash memory and produce new storage devices such as flash disks and memory cards. Moreover, the good qualities that a flash memory owns, including low power consumption, non-volatility, shock resistance, high storage density, and compact size that can be substantially reduced without any assistance of motor or magnetic head, are very suitable to be employed in the compact electronic products such as digital cameras, MP3 mobile mini disks, and personal digital assistant (PDA).

So far, the flash memory has been very successful in developing its high capacity, and now one single flash memory can be as powerful as having 512 mega bytes, while the number of blocks can reach 4096 blocks. However, because the SRAM (static random access memory) on a controller chip is limited, the memory blocks in a flash memory is managed by block segmentation, while the overall management is achieved by a technique called swapping. On the other hand, selection of segments for use is depending on an even allocation method. For example, if a flash memory contains 4096 blocks, then after all the blocks have been divided into four segments for management, each segment may contain 1024 blocks. Theoretically, this method may sound easy for management, but in case that a few blocks has already gone bad, and that all the bad blocks are all aggregated in one segment, the situation may turn into that no block is available for block replacement in that segment. In such case, when data is to be written into the segment, the flash memory may refuse data accessing because there is no replaceable block available for writing. As a result, the user of the flash memory may need to buy another storage device due to malfunction caused by the flash memory, which in turn may increase the user's cost for consuming another storage device.

SUMMARY OF THE INVENTION

The present invention has been accomplished under the circumstances in view. The object of the present invention is to calculate the number of the good blocks in the flash memory in order to adjust the capacity of the flash memory as well as figure out the number of the segment and the number of the good blocks in each segment so that the flash memory may be used with a lower capacity and managed in a more flexible way.

BRIEF DESCRIPTION OF THE DRAWINGS

FIG. 3 is a flow chart illustrating that the flash memory is executing initialization processing according to the embodiment of the present invention.

DETAILED DESCRIPTION OF THE PREFERRED EMBODIMENTS

Figure 1:
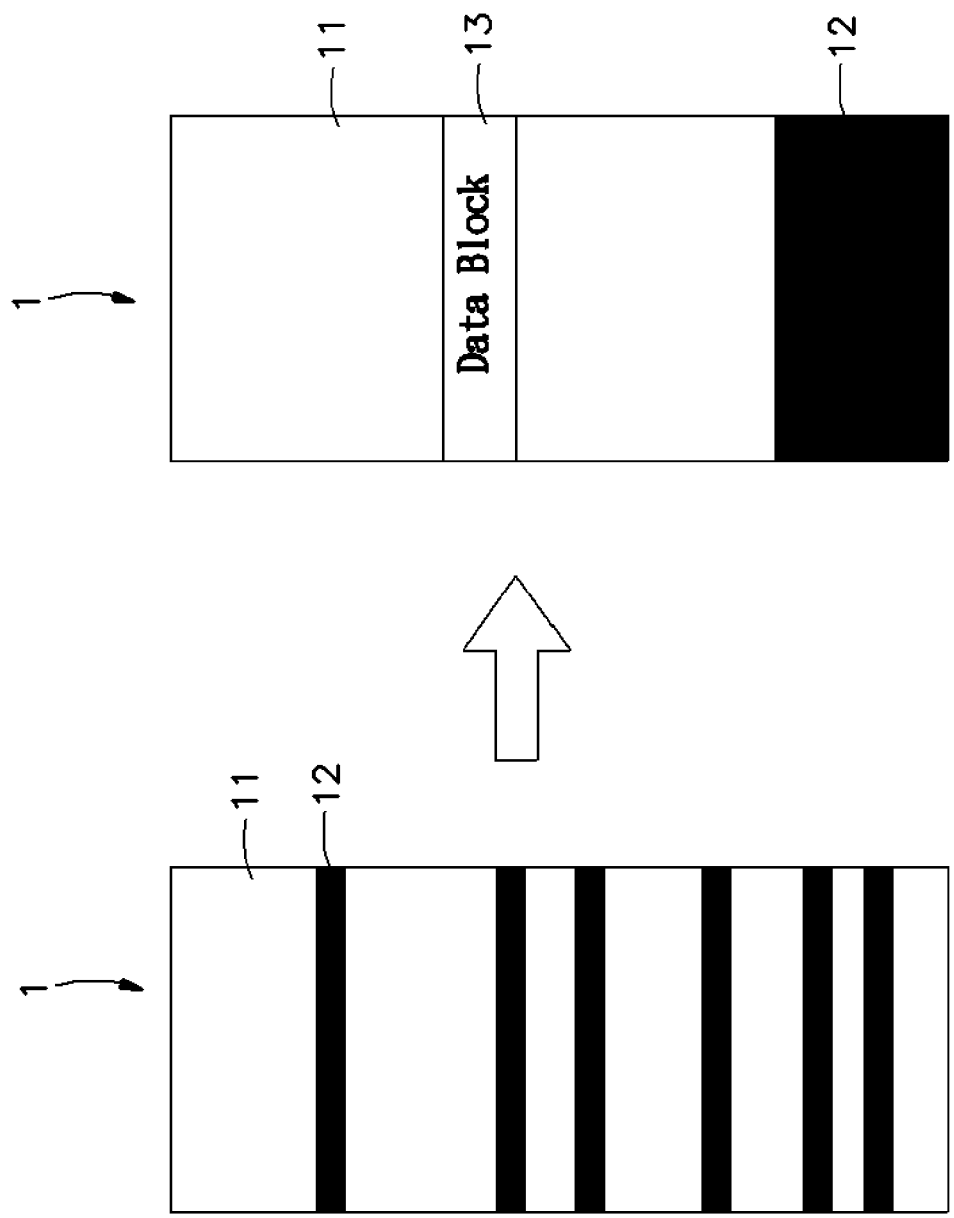
FIG. 1 is a schematic diagram illustrating the method of block calculation according to the embodiment of the present invention.
Figure 2:
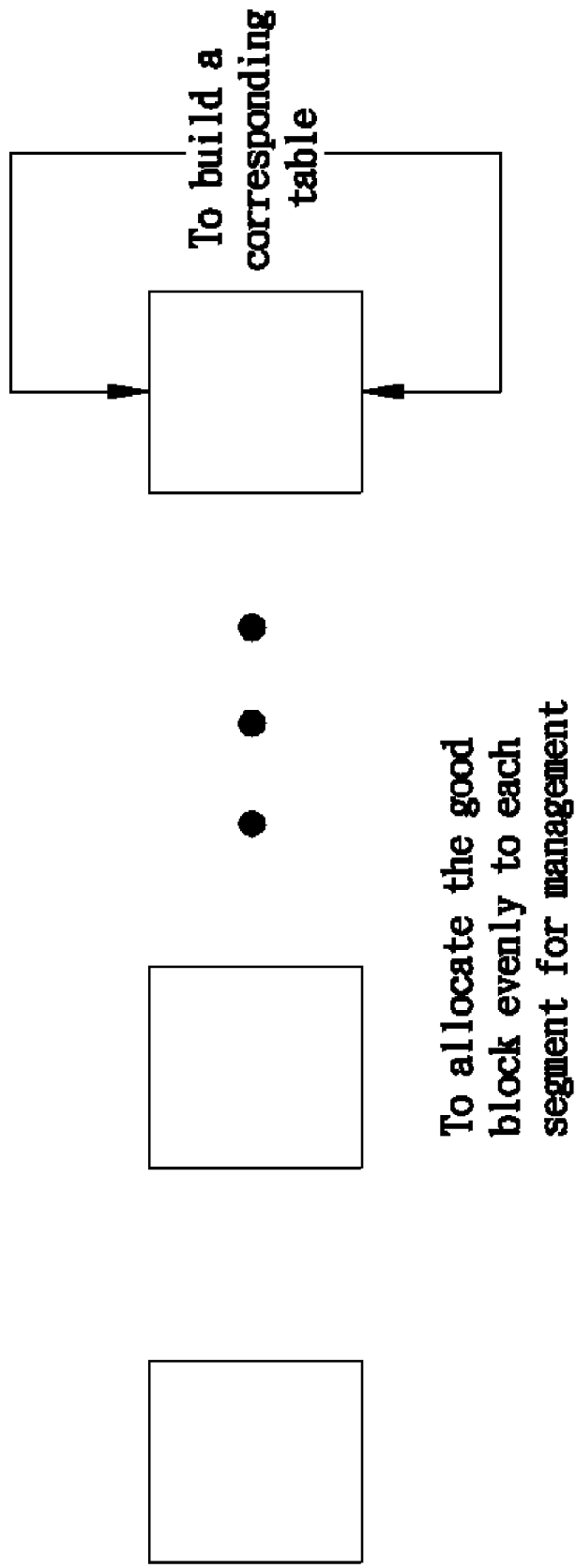
FIG. 2 is a schematic diagram illustrating segment management according to the embodiment of the present invention.

Referring to FIGS. 1 and 2, a controller chip (not shown) of a flash memory 1 will first calculate the total number of good blocks 11 and total number of bad blocks 12 before the flash memory 1 is ready to be used by a user. Next, the good blocks 11 will be evenly allocated to each segment, wherein the allocation is subject to the number of segments contained in the flash memory 1. Afterwards, the number of segments, the number of the good blocks 11 in each segment and the related boundary information will be recorded in one selected good block 11 to form a data block 13. Then, when the flash memory 1 is executing initialization, the controller chip will first find the data block 13 that contains the segment number, the number of the good blocks 11 in each segment and the boundary information, then read the data from the data block 13, and finally store the data in the SRAM of the controller chip. Therefore, when an individual segment is accessed for initialization, the controller chip may generate a corresponding table for the block contained in the segment according to the data stored in the SRAM, thereby managing the flash memory in a more flexible way.

Next, an embodiment of the present invention will be described according to the aforementioned method. To illustrate, if the flash memory 1 contains 4096 blocks, in which the good blocks 12 are 128, and if the number of segments is given as 4 segments, then the number of the good blocks 11 contained in each segment will be calculated as (4096−128)/4=992.

As soon as the number of the good blocks 11 is obtained, the good blocks 11 will be allocated to each segment, starting from the first good block to the $992^{nd}$ good block where the boundary of the first segment will be formed, and the boundary information of the first segment will be recoded. Therefore, through the same allocation method, four segments can be recoded as follows.

$F[0]=0,~F[1]$ $F[1]~F[2]$, $F[2]~F[3]$, $F[3]~F[4]<=4096.$

After recording the segments, the recorded content may be written into one of the good blocks 11 to form the data block 13, and when the flash memory 1 begins to execute initialization, the controller chip will find the data block 13 that contains the recorded content, read the data from the data block 13, and store the data into the SRAM of the flash memory. Then, when an individual segment is being initialized, the controller chip will generate a corresponding table for the block contained int eh segment according to the data store in the SRAM so that the capacity of the flash memory can be better managed.

By so doing, when the bad blocks 12 contained in the flash memory 1 is excessive amount, the capacity of the flash memory 1 may be adjusted according to the number of the good blocks 11 contained in the flash memory 1 as well as figure out the number of the segment and the number of the good blocks 11 contained in each segment. As a result, the flash memory 1 can still be used with lower capacity to succeed the purpose of managing the flash memory 1 more flexibly.

Referring to FIG. 3, and FIGS. 1 and 2 again, when the flash memory 1 containing the data block 13 is executing initialization, the following steps will be performed in a sequential order.

Step 100: the controller chip finds the data block 13 that stores the number of segments, the number of the good blocks 11 in each segment and the related boundary information in the flash memory 1 and then stores the data that is recorded in the data block 13 into the SRAM of the controller chip.

Step 110: to build boundaries and segments in the flash memory 1 according to the data stored in the SRAM.

Step 120: to examine the good blocks 11 in each segment.

Step 130: to build a corresponding table for the block contained in the segment.

In conclusion, a key to improve the method of block management in the flash memory is first to calculate the total number of the good blocks and total number of the bad blocks in the flash memory. Next, all the good blocks and the bad blocks will be allocated evenly to each segment according to the number of the segments in the flash memory, and then the related data will be recorded into the SRAM of the controller chip. By doing so, the controller chip may generate a corresponding table for the block contained in the segment according to the data stored in the SRAM as soon as the flash memory is executing initialization, thereby achieving a better flash memory management. Therefore, the flash memory may not only be used with a lower capacity but also obviate the problem of being unusable when the flash memory contains the excessive bad blocks.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A method for managing memory blocks in flash memory, comprising the steps of first calculating a total number of good blocks and a total number of bad blocks in the flash memory, and then evenly allocating all the good blocks and the bad blocks to each segment according to a number of segments contained in the flash memory; next, recording the data about the allocation in a good block to form a data block so that when the flash memory is executing initialization, a controller chip finds the data block, and stores the data in an SRAM (static random access memory) of the flash memory; wherein, by so doing, the controller chip generates a corresponding table for the block contained in the segment according to the data stored in the SRAM so as to manage the flash memory in a more flexible way.

2. The method for managing memory blocks in flash memory as claimed in claim 1, wherein the data comprises the number of segments, the number of the good blocks contained in each segment, and related boundary information.

3. The method for managing memory blocks in flash memory as claimed in claim 2, wherein when the flash memory containing the data block is executing initialization, the managing method is carried out by executing the following steps in order:

(A) the controller chip finds the data block that stores the number of segments, the number of the good blocks in each segment and the related boundary information in the flash memory and then stores the data recorded in the data block into the SRAM;

(B) the controller chip builds boundaries and segments in the flash memory according to the boundary and segment data stored in the SRAM;

(C) the controller chip examines the good blocks in each segment; and (D) the controller chip builds a corresponding table for the block contained in the segment.

* * * * *